(12) United States Patent
Mittal

(10) Patent No.: US 7,603,605 B2
(45) Date of Patent: Oct. 13, 2009

(54) PERFORMANCE CONTROL OF AN INTEGRATED CIRCUIT

(75) Inventor: Anurag Mittal, San Jose, CA (US)

(73) Assignee: ARM Limited, Cambridge (GB)

( * ) Notice: Subject to any disclaimer, the term of this patent is extended or adjusted under 35 U.S.C. 154(b) by 328 days.

(21) Appl. No.: 11/650,566

(22) Filed: Jan. 8, 2007

(65) Prior Publication Data

US 2008/0168408 A1    Jul. 10, 2008

(51) Int. Cl.
G01R 31/30    (2006.01)
(52) U.S. Cl. .................................................. 714/745
(58) Field of Classification Search ............... 714/718, 714/745
See application file for complete search history.

(56) References Cited

U.S. PATENT DOCUMENTS

| | | | | |
|---|---|---|---|---|
| 6,055,200 A | * | 4/2000 | Choi et al. ............... | 365/201 |
| 6,067,263 A | * | 5/2000 | Brady .................... | 365/201 |
| 6,163,862 A | * | 12/2000 | Adams et al. ............ | 714/718 |
| 6,445,316 B1 | | 9/2002 | Hsu et al. | |
| 6,650,584 B2 | * | 11/2003 | Cowles .................. | 365/201 |
| 6,958,943 B1 | | 10/2005 | Chan et al. | |
| 7,054,213 B2 | * | 5/2006 | Laurent .................. | 365/207 |
| 7,057,415 B2 | | 6/2006 | Allen et al. | |
| 7,142,472 B2 | * | 11/2006 | Usuki ..................... | 365/201 |
| 7,158,426 B2 | * | 1/2007 | van der Zanden et al. ... | 365/201 |
| 7,245,544 B2 | * | 7/2007 | Rohleder ................ | 365/207 |
| 7,266,030 B2 | * | 9/2007 | Do et al. ................. | 365/207 |
| 7,330,387 B2 | * | 2/2008 | Lindstedt et al. .......... | 365/205 |
| 7,376,026 B2 | * | 5/2008 | Vollrath et al. ........... | 365/201 |
| 2005/0243624 A1 | | 11/2005 | Jang | |
| 2006/0077744 A1 | | 4/2006 | Song | |

* cited by examiner

Primary Examiner—James C Kerveros
(74) Attorney, Agent, or Firm—Nixon & Vanderhye P.C.

(57) ABSTRACT

An integrated circuit is provided with a test circuit element and one or more further circuit elements. The performance of the test circuit element at various settings of a performance controlling parameter is determined. That performance controlling parameter is then applied across the one or more further circuit elements. The integrated circuit may include memory banks and the performance controlling parameter can be sense amplifier timing, delay line length or another parameter such as operating voltage, operating frequency and circuit timing in general.

21 Claims, 5 Drawing Sheets

PERFORMANCE CONTROL OF AN INTEGRATED CIRCUIT

BACKGROUND OF THE INVENTION

1. Field of the Invention

This invention relates to the field of integrated circuits. More particularly, this invention relates to the control of the performance of integrated circuits, such as, for example, the control of clock frequency, supply voltage, circuit timings etc.

2. Description of the Prior Art

When an integrated circuit, such as a memory circuit, is designed, various performance parameters of that integrated circuit typically need to be selected by the designer. In the case of memory circuits, the designers use various margining methodologies during the design stage to set parameters such as, for example, the timing of the sense amplifiers. As process technology scales to smaller geometries, the variations between different instances of an integrated circuit become greater such that in order to ensure correct operation of worst-case bit cells and the like across a full range of process-voltage-temperature parameters, these design margins becoming increasingly large and impose a performance constraining limitation upon the integrated circuit, even if that particular integrated circuit would in fact be capable of much higher performance. These large margins to deal with increasing process variation result in a loss of frequency performance, increased power consumption and/or other performance reductions. In the case of the sense amplifier example within a memory circuit, the timing for the sense amplifier is chosen for a worst case bit cell performance and accordingly all the sense amplifiers are timed with that worst case timing irrespective of the particular instance of the integrated circuit memory being capable of higher performance.

Some previous approaches have adopted statistical simulations at the design stage to seek to mitigate these issues by reducing the design margins as much as practice without significantly degrading the yield. However, obtaining relevant statistical standard deviation data for different manufacturing environments is difficult making these approaches impractical. Furthermore, different failure mechanisms will tend to have fundamentally different statistical distributions and there is no single common statistical distribution of errors which will explain all failure mechanism. Furthermore, there is no easy and universally accepted methodology to integrate statistical information into margining methodology to obtain better margins.

SUMMARY OF THE INVENTION

Viewed from one aspect the present invention provides a method of controlling an integrated circuit comprising:

during a testing phase, testing performance of a test circuit element within said integrated circuit at different settings of one or more programmable performance controlling parameters of said test circuit element to generate test results;

setting said one or more programmable performance controlling parameters of one or more further circuit elements within said integrated circuit in dependence upon said test results, said one or more further circuit elements having a variation in performance with said one or more programmable performance controlling parameters that has a known relationship to a variation in performance of said test circuit element with said one or more programmable performance controlling parameters; and during an operational phase, operating at least said one or more further elements with said one or more programmable performance control parameters as set.

The present invention recognises that by providing testing of a representative test circuit element to determine appropriate one or more programmable performance controlling parameters which can then be used in relation to one or more further circuit elements (which have a variation in performance with those parameters, matching the test circuit element), the individual performance of an integrated circuit may be tuned to its actual capabilities and yet the overhead associated with the testing and programmable control of the performance controlling parameters can be kept low. The technique recognizes that in many integrated circuits there are a high number of circuit elements which are repeated in identical or similar forms throughout the integrated circuits and which will share common characteristics as to how they vary in performance in dependence upon a particular control parameter. Thus, the most appropriate setting for that parameter can be established for a test circuit element and then applied across the further circuit elements with a high degree of validity in a manner which enables worst case margining to be advantageously reduced.

Whilst the test circuit element and the one or more further circuit elements need not be identical, the technique is more readily applicable in circumstances where these elements are substantially identical.

The occurrence of circuit elements sharing a common form is particularly prevalent within memory integrated circuits, i.e. memory integrated circuits tend to have highly regular banks of memory laid out in an ordered fashion with circuit elements repeated many times within the integrated circuit as a whole.

Within the context of a memory circuit, one performance controlling parameter which needs setting concerns the timing of bit line sense amplifiers. Excessive worst case margining significantly reduces the read speed of the memory. The present technique can be used to establish a more realistic timing for the sense amplifiers based upon the actual instance of the integrated circuit concerned and this then applied across a set of sense amplifiers within that instance.

Whilst it will be appreciated that the programmable performance controlling parameter can take a variety of different forms, and the present technique is applicable across these forms, particular examples of such parameters are an operating voltage, an operating clock frequency and a circuit timing value.

The test results returned by the testing phase can be simple pass fail results for particular settings, but may also be results including test statistics representing the probability of erroneous operation at different settings, such that the parameters can be set based upon statistical analysis rather than simple worst case margining.

A further refinement can be that the setting of the programmable performance controlling parameters is be dependent upon the test statistics and a known level of redundancy within the further circuit elements. As an example, if the integrated circuit is known to have redundancy sufficient to cope with a certain number of a particular type of failure (e.g. memory row failures, memory column failures etc), then the parameters can be set such that the use of this available redundancy is taken into account when determining to what level to set the control parameters to meet desired reliability goals.

Whilst the integrated circuit may contain a single test circuit establishing a control parameter for one or more further circuit elements, the technique may be more generally applied with the provision of a plurality of test circuits each responsible for determining control parameters for a group of further circuit elements which are spatially closest to the test circuit element concerned. This is important where circuit parameters vary significantly with spatial distance.

The testing and setting may be controlled by an on-chip test controller or an off-chip test controller. Both have different advantages and disadvantages, such as a self-contained real time parameter setting for the on-chip variant versus a reduced circuit overhead and complexity overhead for production integrated circuits when an off-chip test controller is used.

The control parameter(s) can be stored within non-volatile storage such that it is preserved across uses of the integrated circuit. The testing and setting may be performed as part of manufacturing test and additionally/alternatively on a real time basis to dynamically adjust a control parameter by repeated testing and setting operations.

Viewed from another aspect the present invention provides an integrated circuit comprising:

test circuitry responsive to performance of a test circuit element within said integrated circuit during a testing phase at different settings of one or more programmable performance controlling parameters of said test circuit element to generate test results;

performance controller circuitry responsive to said test results to set said one or more programmable performance controlling parameters of one or more further circuit elements within said integrated circuit, said one or more further circuit elements having a variation in performance with said one or more programmable performance controlling parameters that has a known relationship to a variation in performance of said test circuit element with said one or more programmable performance controlling parameters; wherein during an operational phase, at least said one or more further elements operate with said one or more programmable performance control parameters as set.

Viewed from a further aspect the present invention provides an integrated circuit comprising:

test means for testing performance of a test circuit element within said integrated circuit during a testing phase at different settings of one or more programmable performance controlling parameters of said test circuit element to generate test results;

performance controller means for setting said one or more programmable performance controlling parameters of one or more further circuit elements within said integrated circuit in response said test results, said one or more further circuit elements having a variation in performance with said one or more programmable performance controlling parameters that has a known relationship to a variation in performance of said test circuit element with said one or more programmable performance controlling parameters; wherein during an operational phase, at least said one or more further elements operate with said one or more programmable performance control parameters as set.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
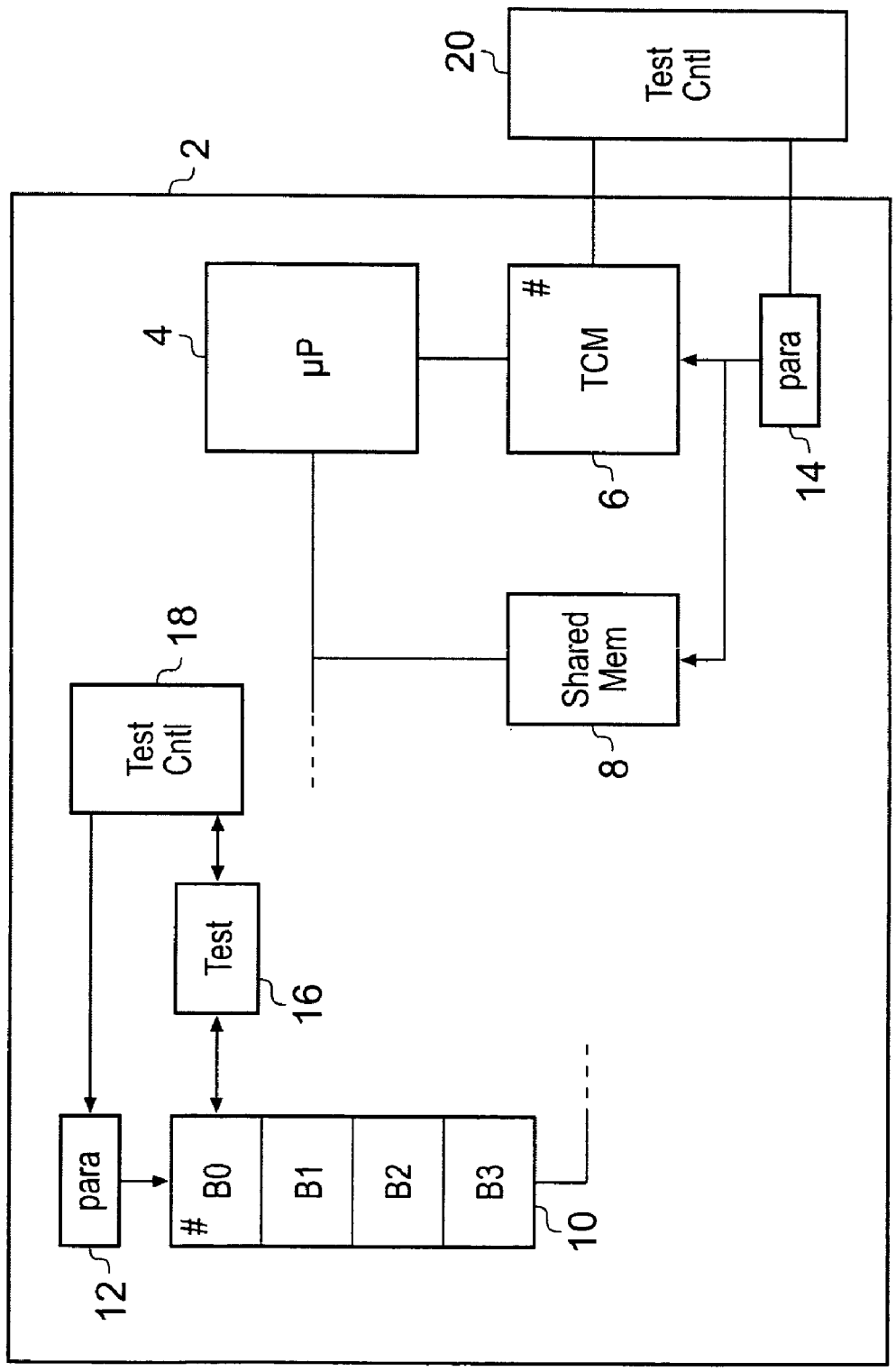
FIG. 1 schematically illustrates an integrated circuit having multiple on-chip memories with programmable performance controlling parameters.

FIG. 1 illustrates an integrated circuit 2 including a processor core 4, a tightly coupled memory 6, a shared memory 8 and a main random access memory 10 composed of multiple memory banks B0, B1, B2, B3. The operation of the main random access memory 10 and the tightly coupled memory 6 is controlled using a programmable performance controlling parameter stored within respective non-volatile stores 12, 14. As an example, the performance controlling parameters can be used to set the sense amplifier timing for reading bit line values within the memory arrays concerned. Another example would be setting delay line length to be used for self-timing mechanisms within the memory arrays with length or tapping point of the delay line being set by the programmable control parameter.

In the case of the main random access memory 10, the memory bank B0 is the one subject to testing to determine the appropriate control parameter setting and this is indicated by the "#" symbol. The memory bank B0 accordingly serves as a test circuit element within the integrated circuit. A test circuit 16 serves to measure the response of the test circuit element B0 to various control parameter settings. The non-volatile storage 12 (volatile storage may be possible in embodiments using external testing) serves as the performance controller circuitry by holding a programmable value which sets the performance parameter used by the memory bank B0. A test controller 18 serves to coordinate the action of the testing and setting by selecting various control parameter values to cover a range of settings and then determining the behaviour of the memory bank B0 in response to those different control parameter values. The test controller 18 then selects an appropriate value to be used during the operational phase and applied to the other memory banks B1, B2, B3 within the main random access memory 10. It will thus be seen that the main random access memory 10 is subject to a test phase during which the performance of the memory bank B0 is tested at different parameter settings (e.g. sense amplifier timings, operating voltages, operating frequencies etc) and then a value for the programmable performance controlling parameter is stored within and set by the non-volatile storage 12 serving as the performance controller circuitry and applied throughout the main random access memory 10 including all banks B0, B1, B2 and B3 during the operational phase.

The testing phase could take place as a one-time operation as part of manufacturing test, with the value of the programmable performance controlling parameter thereafter remaining fixed for the particular integrated circuit 2. Alternatively or additionally, the testing phase may be periodically repeated to track variations in performance, such as variations due to environment conditions (e.g. temperature variations induced by the surrounding and/or operating environment).

The integrated circuit 2 also includes a tightly coupled memory 6 and a shared memory 8. The tightly coupled memory 6 serves as a test circuit element for which a performance controlling parameter is determined by an external test controller 20 during a testing phase. During an operational phase, that performance controlling parameter is applied to both the tightly coupled memory 6 and the shared memory 8, which is physically close to the tightly coupled memory 6 and accordingly likely to be subject to the same limitations/requirements. It will be appreciated that this behaviour assumes a substantially identical form for the tightly coupled memory and the shared memory 8, at least in respect of how they vary in their performance with variation in the programmable performance controlling parameter applied thereto. The shared memory 8 and the tightly coupled memory 6 could be formed with circuit elements drawn from the same design library but compiled into different sizes of memories as one example.

Figure 2:
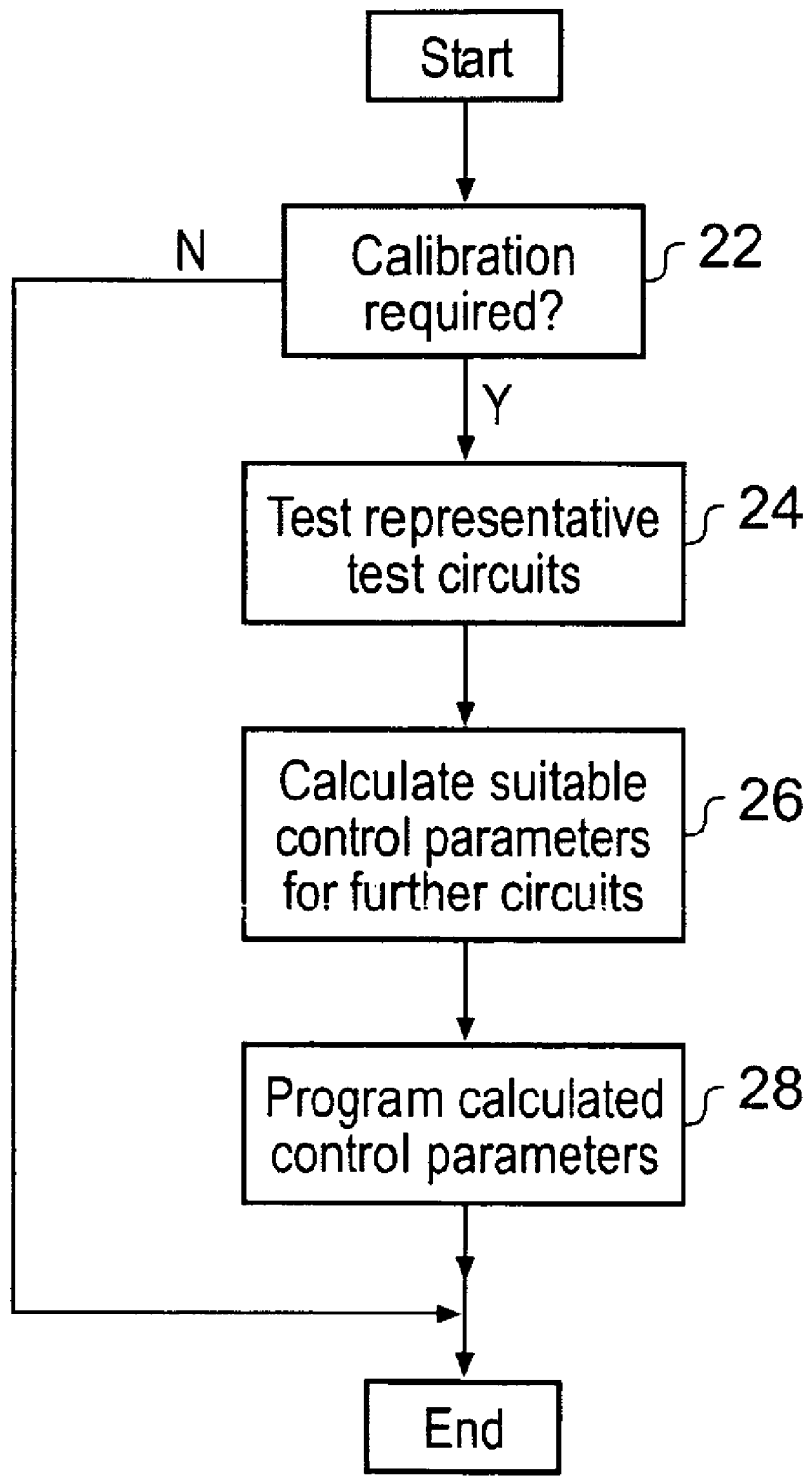
FIG. 2 is a flow diagram schematically illustrating the testing and parameter setting process.

FIG. 2 is a flow diagram schematically illustrating the testing phase of operation. At step 22, it is determined whether calibration of the integrated circuit is required. If calibration is required, e.g. this is the first time the integrated circuit has been used, a periodic time corresponding to a repeat interval of testing has been reached, or an external parameter has significantly varied (e.g. temperature), then processing proceeds to step 24 at which representative test circuits are subject to tests to establish the performance thereof using different control parameters. At step 26 suitable control parameters for further circuits having a known relationship to a variation in performance of said test circuit element with respect to said parameter are calculated or otherwise established (e.g. using statistically based calculations based upon the probabilities of failure associated with the known degrees of redundancy available to deal with certain failure rates within the circuitry (e.g. redundant memory rows and/or columns, ECC mechanisms etc)). At step 28 the calculated control parameters are programmed into the performance controller circuitry to control the operation of the multiple circuit elements controlled thereby.

Figure 3:
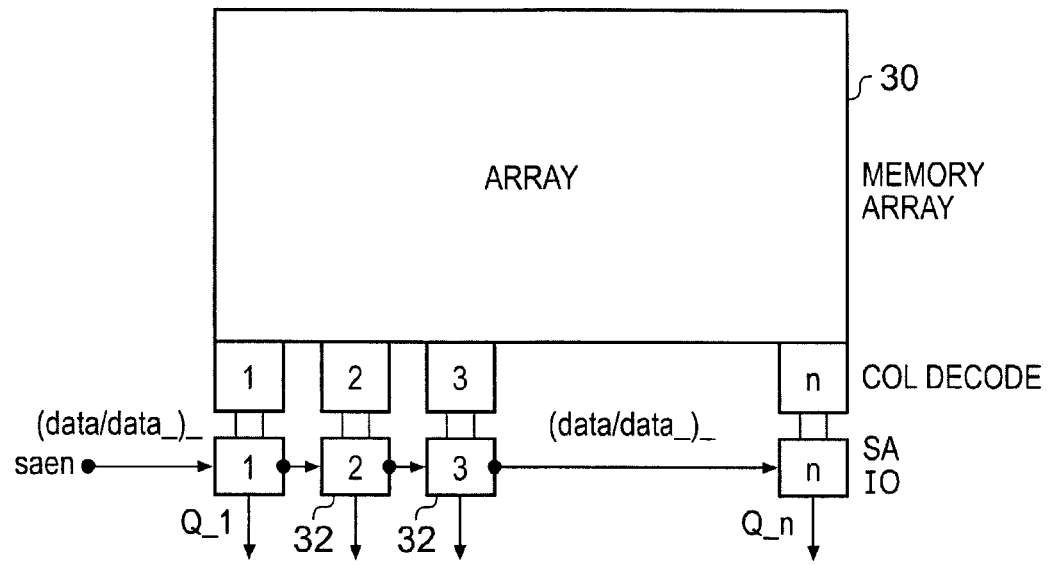
FIG. 3 is a diagram schematically illustrating sense amplifiers associated with an array of bit cells within a memory.

FIG. 3 illustrates a conventional memory array 30 having sense amplifiers 32 associated with bit line outputs thereof. The sense amplifiers 32 are controlled by a sense enable signal SAEN, which controls the timing of the point at which the sense amplifiers 32 measure the differential between bit line voltages, and accordingly sense a bit 0 or a bit 1. It will be appreciated that switching the sense amplifiers 32 on too soon may result in the wrong value being read. Conversely, switching the sense amplifiers on too late will result in reduced speed. Normal design practice is to allow a worst case margin for the timing of the sense amplifiers and this will tend to switch them on later than is actually required and accordingly needlessly waste performance.

Figure 4:
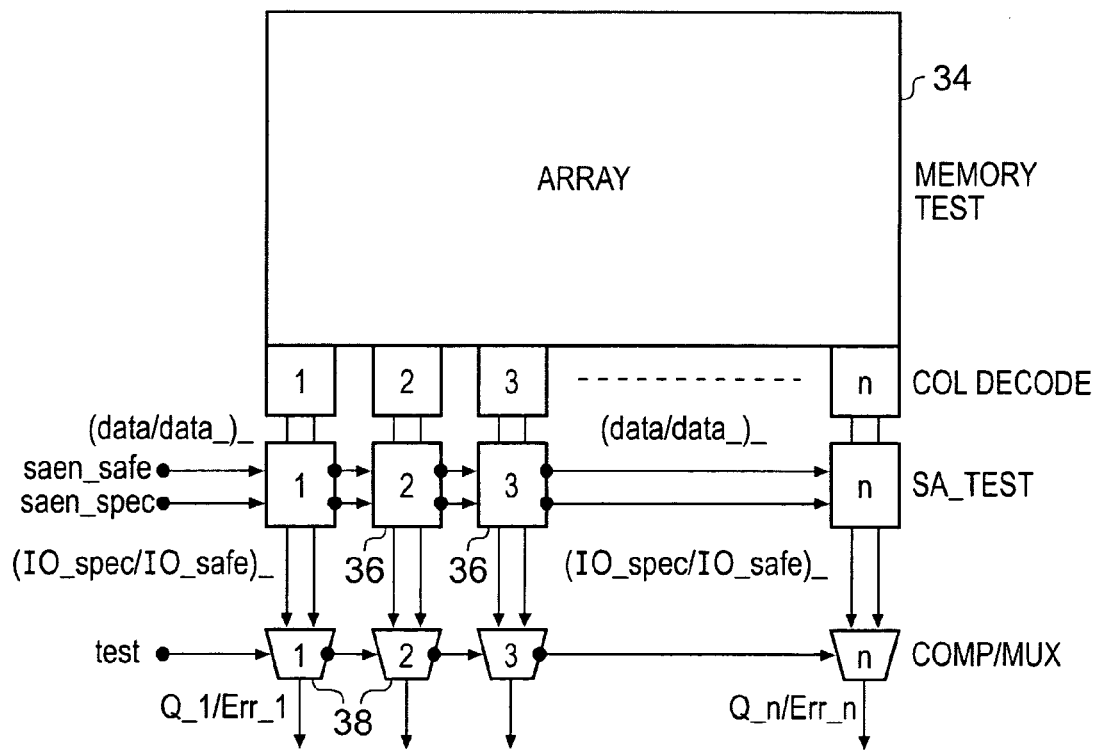
FIG. 4 is a diagram schematically illustrating testing of sense amplifier timing to establish an appropriate programmable control parameter which can then be applied to the memory array concerned as well as further memory arrays having a substantially identical form.

FIG. 4 illustrates a memory array 34 in which modified sense amplifiers 36 are provided and have the ability to test the performance of the sense amplifier circuits within the instance of an integrated circuit in which they are embodied. In particular, the sense amplifiers 36 are provided with two timing signals. One is a safe timing signal, with a significant worst case margin which is "guaranteed" to read the correct value. The second is a speculative sense amplifier timing signal which switches the sense amplifier on earlier, and accordingly may incorrectly read a bit value if the bit line voltages have not yet swung sufficiently. Switching the sense amplifier on sooner increases speed, but risks erroneous operation. During a testing phase, different speculative sense amplifier timings are employed to find the one which increases speed to a desired extent whilst avoiding erroneous operation by actually switching the sense amplifier on too soon. During this testing operation, multiplexers 38 serve to output either the safe value or the speculative value from the array and these safe and speculative values are compared by the test controller concerned with any difference being indicative of an error and accordingly that the speculative value is unsafe and more margin is required for that actual instance of the memory integrated circuit. The process is repeated for all the memory elements of the instance under test until statistical failure rates as a function of control timings are obtained, which can then be utilized to set the timings under normal operation. The control parameters may be adjusted based upon known characteristics of the devices to which they are to be applied, e.g. to take account of different sizes, voltages, frequencies, etc and also possibly to add some additional margin.

Figure 5:
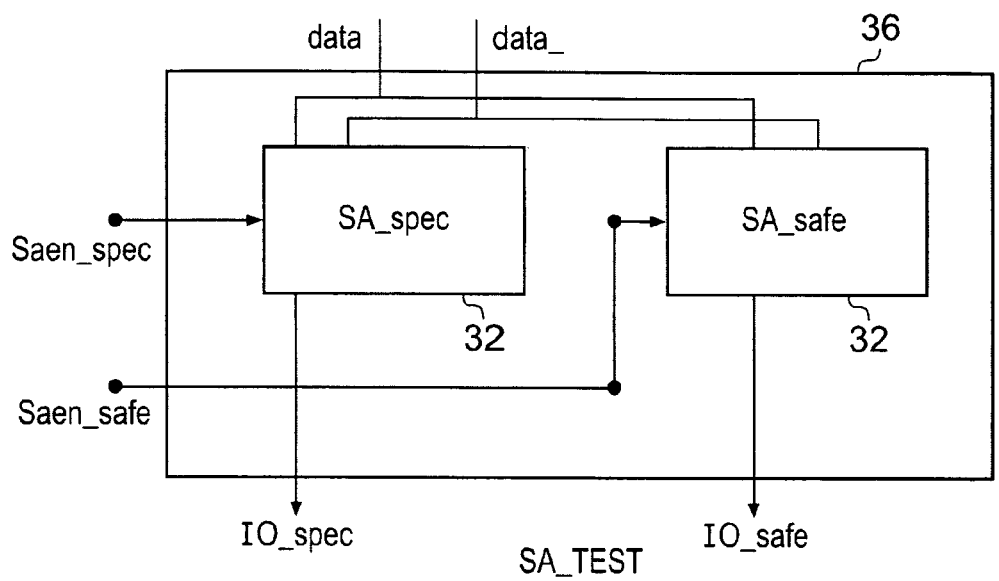
FIG. 5 is a diagram schematically illustrating the logic form of a test amplifier modified to perform this testing function.

FIG. 5 schematically illustrates the logical design of the test sense amplifiers 36 in more detail. Included within these are two sense amplifiers 32 of the form which are found on the remainder of the memory arrays. Using the same sense amplifiers within the test circuit element as will be used within the one or more further circuit elements increases the validity of applying the determined control parameter from the test element across the one or more further circuit elements.

Figure 6:
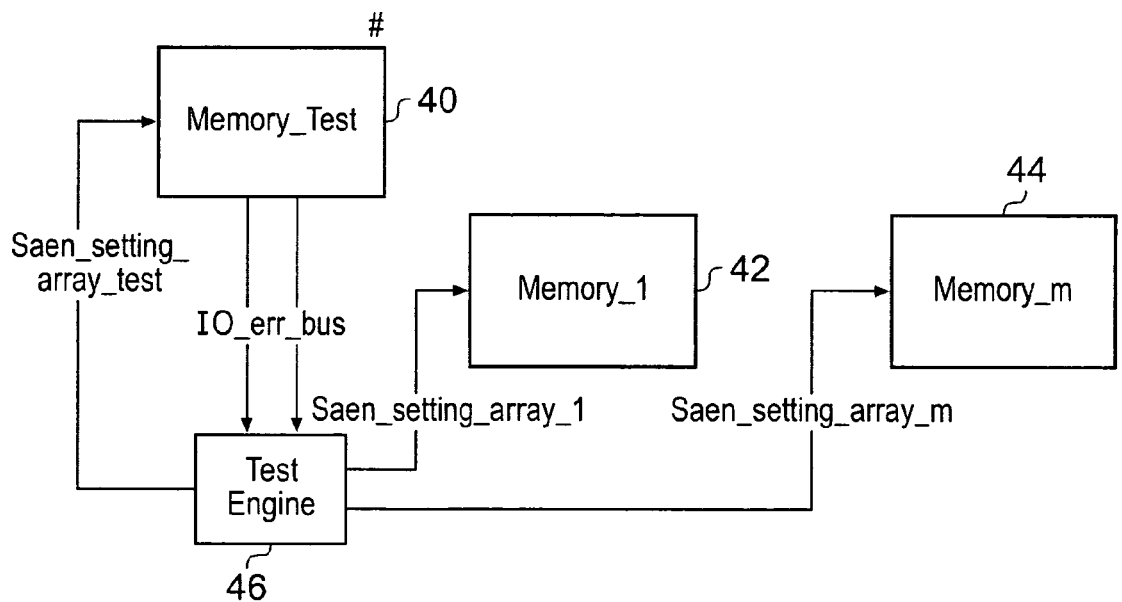
FIG. 6 illustrates an example in which a sense amplifier setting for a test memory array is applied to spatially proximal further memory arrays.

FIG. 6 illustrates an example in which multiple memory arrays 40, 42, 44 are connected to a single test engine 46. The test engine 46 controls testing of sense amplifier thing to be performed upon the memory array 40. A programmable performance controlling parameter determined by this testing is then applied to the other memory arrays 42, 44. The parameter applied to these other memory arrays 42, 44, may be the same parameter or a different parameter having a known relationship to the parameter which has been determined. It is statistically likely that manufacturing or process variations which influence the performance of the memory array 40 will also influence the performance of the memory arrays 42 and 44 in a similar, or at least highly correlated way. The present technique exploits this by performing a test upon one test circuit element and then applying the determined parameter across several further circuit elements without having to deploy test mechanisms within those further circuit elements.

It will be appreciated that within a large integrated circuit there may be many groups of circuit elements with matching characteristics and these groups can have respective performance controlling parameters determined therefor by their own local test circuit elements with those respective performance controlling parameters then being applied within their local group. In this way, process variations across an individual integrated circuit, or environmental variations across an individual integrated circuit, may be accounted for without excessive margining.

Figure 7:
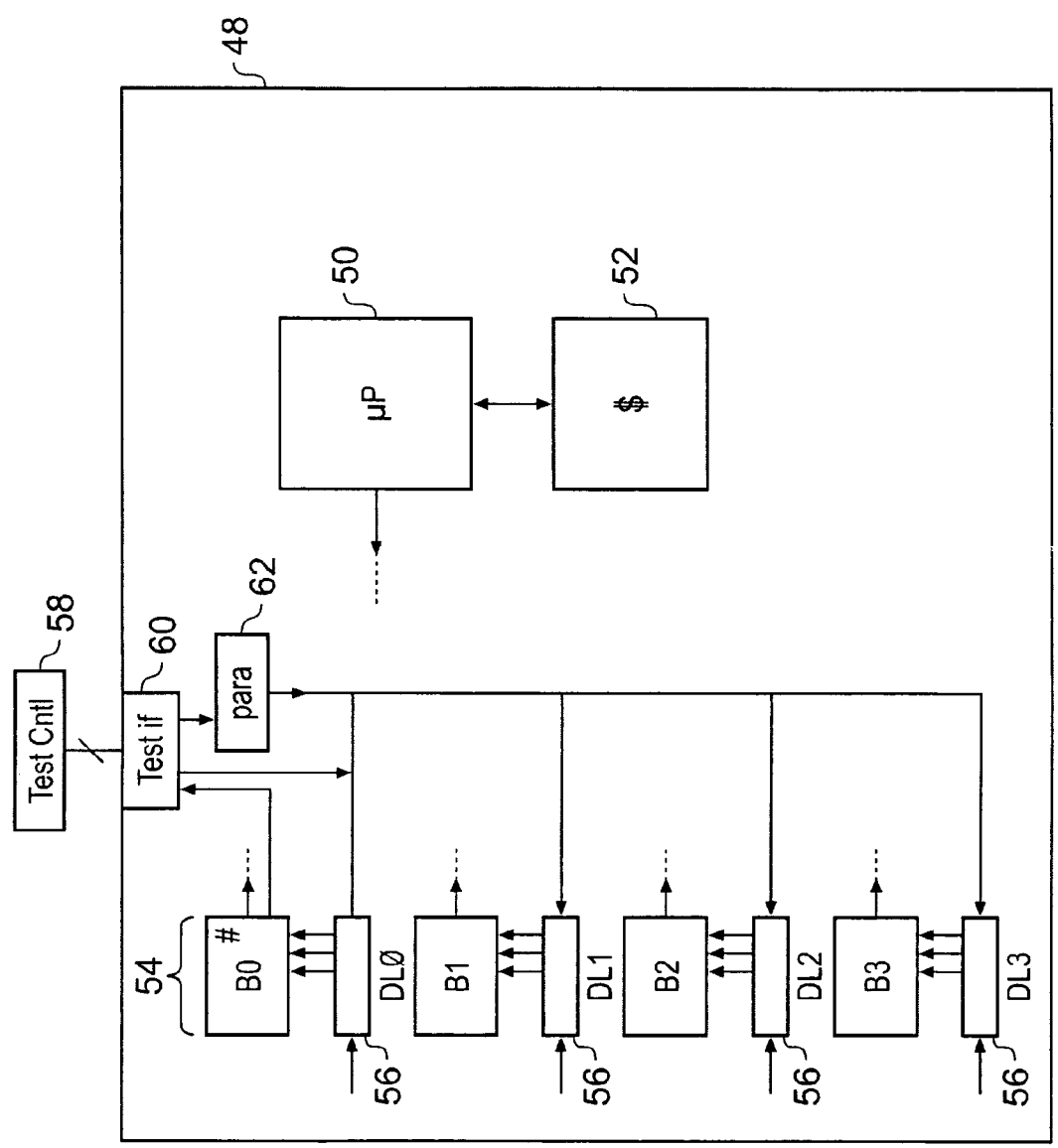
FIG. 7 illustrates a further example integrated circuit including multiple banks of memory and an off-chip test controller.

FIG. 7 illustrates a further example embodiment. An integrated circuit 48 is provided with a processor core 50 having a cache memory 52 as well as a main random access memory 54 provided on-chip. This main random access memory 54 is divided into four memory banks B0, B1, B2, B3. A delay line 56 associated with each of these memory banks B0, B1, B2, B3 is used as part of the self-timing mechanisms for these circuit elements. The length of the delay line 56 employed is a performance controlling parameter. An excessively long delay line will limit speed performance, whilst an excessively short delay line may result in erroneous operation. Various taps from this delay line may be employed to generate a self-timing signal. In operation, an external test controller 58 communicating through a test interface 60 is used to set a performance controlling parameter within a non-volatile store 62 which selects one of the taps from the delay lines 56 for use. The operation of the memory with that delay timing is then established. If the operation is correct, then a shorter delay line can be tested until the failure point is reached. The actual delay line length is then selected to take account of the statistical probability of error occurrence in combination within any in-built redundancy mechanism provided, e.g. failure in two memory rows may be the limiting condition when one redundant memory row is built in.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A method of controlling an integrated circuit including a test memory array having a plurality of memory elements storing respective bit values, said method comprising the steps of:
    during a testing phase:
    (i) performing a first read, using a sense amplifier controlled by a speculative timing signal, of a bit value stored within a memory element of said test memory array and outputting a speculative value;
    (ii) performing a second read, using a sense amplifier controlled by a safe timing signal, of said bit value stored within said memory element and outputting a safe value;
    (iii) comparing said speculative value and said safe value with a difference between said speculative value and said safe value indicating a read failure due to said speculative timing signal controlling said first sense amplifier to read said bit value too soon; and
    (iv) repeating said first read and said second read for a plurality of different memory elements within said test memory array and for a plurality of different timings of said speculative timing signal so as to obtain as test results a measure of read failure rate as a function of timing of said speculative timing signal;
    setting a programmable sense amplifier timing parameter of one or more further memory arrays within said integrated circuit in dependence upon said measure; and
    during an operational phase, operating said one or more further memory arrays using said programmable sense amplifier timing parameter.

2. A method as claimed in claim 1, wherein said one or more further memory arrays are substantially identical to said test memory array.

3. A method as claimed in claim 1, wherein said programmable sense amplifier timing parameter is a switch on timing of said bit line sense amplifiers.

4. A method as claimed in claim 1, wherein said test results include test statistics representing probabilities of erroneous operation at different settings of said sense amplifier timing.

5. A method as claimed in claim 1, comprising:
    during said test phase, testing performance of a plurality test memory arrays within said integrated circuit to generate a plurality of test results; and
    setting said programmable sense amplifier timing parameters for each group of a plurality of groups of one or more further memory arrays within said integrated circuit in dependence upon test results for a test memory arrays at a spatially closest position within said integrated circuit to said group; and
    during said operational phase, operating at least said plurality of groups of one or more further memory arrays using respective programmable sense amplifier timing parameters.

6. A method as claimed in claim 1, wherein said testing phase and said setting are controlled by a test controller within said integrated circuit.

7. A method as claimed in claim 1, wherein said testing phase and said setting are controlled by a test controller outside said integrated circuit.

8. A method as claimed in claim 1, wherein said programmable sense amplifier timing parameter is stored within a non-volatile store within said integrated circuit.

9. A method as claimed in claim 1, wherein said testing phase and said setting are performed as part of manufacturing test operations with said programmable sense amplifier testing parameters being fixed after said manufacturing test operations.

10. A method as claimed in claim 1, wherein said testing phase and said setting are performed repeatedly as part of real time test operations with said programmable sense amplifier timing parameter being varied in dependence upon said real time test operations.

11. An integrated circuit comprising:
    a test memory array having a plurality of memory elements storing respective bit values and one or more further memory arrays;
    test circuitry configured so as during a testing phase:
    (i) to perform a first read, using a sense amplifier controlled by a speculative timing signal, of a bit value stored within a memory element of said test memory array and outputting a speculative value; (ii) to perform a second read, using a sense amplifier controlled by a safe timing signal, of said bit value stored within said memory element and outputting a safe value;
    (iii) to compare said speculative value and said safe value with a difference between said speculative value and said safe value indicating a read failure due to said speculative timing signal controlling said first sense amplifier to read said bit value too soon; and
    (iv) to repeat said first read and said second read for a plurality of different memory elements within said test memory array and for a plurality of different timings of said speculative timing signal so as to obtain as test results a measure of read failure rate as a function of timing of said speculative timing signal;
    performance controller circuitry configured to set a programmable sense amplifier timing parameter of said one or more further memory arrays within said integrated circuit in dependence upon said measure, such that during an operational phase, said one or more further memory arrays operate using said programmable sense amplifier timing parameter.

12. An integrated circuit as claimed in claim 11, wherein said one or more further memory arrays are substantially identical to said test memory array.

13. An integrated circuit as claimed in claim 11, wherein said programmable sense amplifier timing parameter is a switch on timing of said bit line sense amplifiers.

14. An integrated circuit as claimed in claim 11, wherein said test results include test statistics representing probabilities of erroneous operation at different settings of said programmable sense amplifier timing parameters.

15. An integrated circuit as claimed in claim 11, wherein
said test circuitry tests performance of a plurality of test memory arrays within said integrated circuit to generate a plurality of test results; and said performance controller circuitry sets said programmable sense amplifier timing parameters for each group of a plurality of groups of one or more further memory arrays within said integrated circuit in dependence upon test results for a test memory array at a spatially closest position within said integrated circuit to said group; wherein during an operational phase, at least said plurality of groups of one or more further memory arrays operate using respective programmable sense amplifier parameters.

16. An integrated circuit as claimed in claim 11, wherein said test circuitry and said performance controller circuitry are controlled by a test controller within said integrated circuit.

17. An integrated circuit as claimed in claim 11, wherein said test circuitry and said performance controller circuitry are controlled by a test controller outside said integrated circuit.

18. An integrated circuit as claimed in claim 11, wherein said programmable sense amplifier timing parameters is stored within a non-volatile store within said integrated circuit.

19. An integrated circuit as claimed in claim 11, wherein test circuitry and said performance controller circuitry operate as part of manufacturing test operations with said programmable sense amplifier timing parameters being fixed after said manufacturing test operations.

20. An integrated circuit as claimed in claim 11, wherein test circuitry and said performance controller circuitry operate repeatedly as part of real time test operations with said programmable sense amplifier timing parameter being varied in dependence upon said real time test operations.

21. An integrated circuit comprising:

a test memory array having a plurality of memory elements storing respective bit values and one or more further memory arrays;

test means active during a testing phase:
(i) for performing a first read, using a sense amplifier controlled by a speculative timing signal, of a bit value stored within a memory element of said test memory array and outputting a speculative value; (ii) for performing a second read, using a sense amplifier controlled by a safe timing signal, of said bit value stored within said memory element and outputting a safe value;
(iii) for comparing said speculative value and said safe value with a difference between said speculative value and said safe value indicating a read failure due to said speculative timing signal controlling said first sense amplifier to read said bit value too soon; and
(iv) for repeating said first read and said second read for a plurality of different memory elements within said test memory array and for a plurality of different timings of said speculative timing signal so as to obtain as test results a measure of read failure rate as a function of timing of said speculative timing signal;

performance controller means for setting a programmable sense amplifier timing parameter of said one or more further memory arrays within said integrated circuit in dependence upon said measure, such that during an operational phase, said one or more further memory arrays operate using said programmable sense amplifier timing parameter.

* * * * *